(12) United States Patent
Craske

(10) Patent No.: US 11,152,076 B2
(45) Date of Patent: Oct. 19, 2021

(54) APPARATUS AND METHOD FOR EXECUTING DEBUG INSTRUCTIONS

(71) Applicant: Arm Limited, Cambridge (GB)

(72) Inventor: Simon John Craske, Cambridge (GB)

(73) Assignee: Arm Limited, Cambridge (GB)

( * ) Notice: Subject to any disclaimer, the term of this patent is extended or adjusted under 35 U.S.C. 154(b) by 100 days.

(21) Appl. No.: 16/578,754

(22) Filed: Sep. 23, 2019

(65) Prior Publication Data

US 2021/0090677 A1 Mar. 25, 2021

(51) Int. Cl.
*G11C 29/00* (2006.01)
*G11C 29/38* (2006.01)
*G06F 9/30* (2018.01)

(52) U.S. Cl.
CPC .......... *G11C 29/38* (2013.01); *G06F 9/3005* (2013.01); *G06F 9/30101* (2013.01)

(58) Field of Classification Search
None
See application file for complete search history.

(56) References Cited

U.S. PATENT DOCUMENTS 6,065,106 A * 5/2000 Deao ................ G01R 31/31705
712/227
2014/0281695 A1 * 9/2014 Kraipak ............. G06F 11/0721
714/10

2017/0060582 A1 * 3/2017 Brites ................ G06F 11/3648
2020/0319991 A1 * 10/2020 Alexander ................ G06F 9/48

FOREIGN PATENT DOCUMENTS

GB 2563884 1/2019

* cited by examiner

*Primary Examiner* — Guerrier Merant
(74) *Attorney, Agent, or Firm* — Nixon & Vanderhye P.C.

(57) ABSTRACT

An apparatus and method are provided for executing debug instructions. The apparatus has processing circuitry for executing instructions fetched from memory, and a debug interface. The processing circuitry is responsive to a halt event to enter a halted mode where the processing circuitry stops executing the instructions fetched from memory, and instead is arranged to execute debug instructions received from a debugger via the debug interface. The processing circuitry is responsive to detection of a trigger condition when executing a given debug instruction to exit the halted mode transparently to the debugger, and to take an exception in order to execute exception handler code comprising a sequence of instructions fetched from memory. On return from the exception, the processing circuitry then re-enters the halted mode and performs any additional processing required to complete execution of the given debug instruction. This provides a mechanism for allowing an apparatus to perform operations required by debug instructions in situations where the processing circuitry hardware is not able to natively perform those operations in response to the specified debug instruction.

14 Claims, 5 Drawing Sheets

APPARATUS AND METHOD FOR EXECUTING DEBUG INSTRUCTIONS

BACKGROUND

The present technique relates to an apparatus and method for executing debug instructions.

In order to allow debug instructions to be executed by processing circuitry, it is known to be able to place the processing circuitry into a halted mode where it ceases its normal execution behaviour, and instead performs operations in response to debug instructions forwarded to it by a debugger.

However, it has been found that in some situations it may be the case that the processing circuitry hardware is unable to respond natively to one or more debug instructions received by the debugger. It would be desirable to enable the handling of such debug instructions.

SUMMARY

In one example arrangement, there is provided an apparatus comprising: processing circuitry to execute instructions fetched from memory; and a debug interface; wherein the processing circuitry is responsive to a halt event to enter a halted mode where the processing circuitry stops executing the instructions fetched from memory and instead is arranged to execute debug instructions received from a debugger via the debug interface; wherein the processing circuitry is responsive to detection of a trigger condition when executing a given debug instruction to: exit the halted mode transparently to the debugger; take an exception in order to execute exception handler code comprising a sequence of instructions fetched from the memory; and on return from the exception, re-enter the halted mode and perform any additional processing required to complete execution of the given debug instruction.

In another example arrangement, there is provided a method of executing debug instructions, comprising: employing processing circuitry to execute instructions fetched from memory; causing the processing circuitry to respond to a halt event by entering a halted mode where the processing circuitry stops executing the instructions fetched from memory and instead is arranged to execute debug instructions received via a debug interface from a debugger; in response to detection of a trigger condition when executing a given debug instruction, causing the processing circuitry to: exit the halted mode transparently to the debugger; take an exception in order to execute exception handler code comprising a sequence of instructions fetched from the memory; and on return from the exception, re-enter the halted mode and perform any additional processing required to complete execution of the given debug instruction.

In a still further example arrangement, there is provided an apparatus comprising: processing means for executing instructions fetched from memory; debug interface means; the processing means for responding to a halt event by entering a halted mode where the processing means stops executing the instructions fetched from memory and instead is arranged to execute debug instructions received from a debugger via the debug interface means; the processing means for responding to detection of a trigger condition when executing a given debug instruction by: exiting the halted mode transparently to the debugger; taking an exception in order to execute exception handler code comprising a sequence of instructions fetched from the memory; and on return from the exception, re-entering the halted mode and performing any additional processing required to complete execution of the given debug instruction.

BRIEF DESCRIPTION OF THE DRAWINGS

The present technique will be described further, by way of illustration only, with reference to examples thereof as illustrated in the accompanying drawings, in which.

DESCRIPTION OF EXAMPLES

Figure 1:
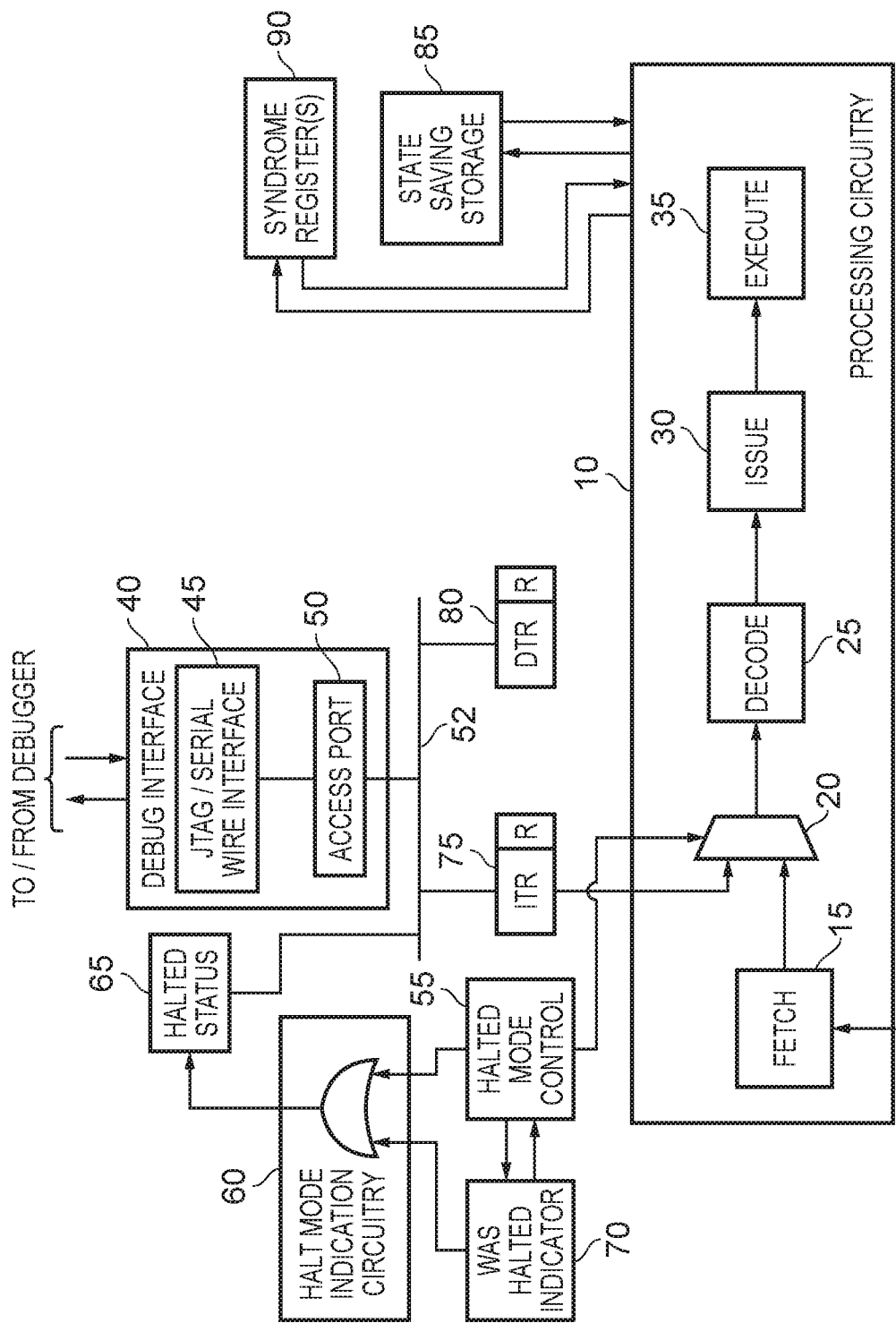
FIG. 1 is a block diagram of an apparatus in accordance with one example implementation.

It is known to provide an apparatus with a debug interface via which a debugger can input debug instructions for execution by the processing circuitry of the apparatus. To enable the debug instructions to be executed, the apparatus may first be placed into a halted mode where it ceases its normal instruction execution activities, and instead operates directly in response to the debug instructions that it receives via the debug interface. However, in certain systems, such as those deploying complex environments, for example background access checking, encryption and/or complex services, it may be the case the processing circuitry hardware cannot respond natively to certain debug instructions received via an external debugger. In particular, it may be the case that, taking into account the complex environment of the processing circuitry, it is necessary for one or more additional operations to be performed in association with the operation that is specified by the debug instruction. Such additional operations might normally be performed by executing one or more additional instructions, but in the halted mode the processing circuitry is only in a position to execute the actual debug instructions received via the debugger, and it would be desirable not to have to alter the behaviour of the debugger to take into account the operating environment of the processing circuitry.

In accordance with the techniques described herein, a mechanism is provided that enables the apparatus to handle such situations, in a manner that is transparent to the debugger. In one example arrangement an apparatus is provided that has processing circuitry for executing instructions fetched from memory. The apparatus also provides a debug interface via which the apparatus can be coupled to a debugger. Such a debugger may be a dedicated external debugging apparatus, or may be provided by debugging software executing on a general purpose computer.

In response to a halt event, the processing circuitry is caused to enter a halted mode where the processing circuitry stops executing the instructions fetched from memory, and instead is arranged to execute debug instructions received from a debugger via the debug interface. The halt event can take a variety of forms. For example, it may occur in response to a halt command issued from the debugger, or alternatively could occur as the result of an external halt trigger. As another example, the halt event may occur as a result of the processing circuitry encountering a breakpoint or watchpoint condition. For the purposes of the technique described in the present application, it does not matter what causes the halt event to occur, but on occurrence of the halt event the processing circuitry will enter the halted mode.

As discussed earlier, when in the halted mode, the processing circuitry will execute debug instructions received via the debug interface. However, in accordance with the techniques described herein, the processing circuitry is responsive to detecting a trigger condition when executing a given debug instruction, to exit the halted mode transparently to the debugger and take an exception in order to execute exception handler code comprising a sequence of instructions fetched from the memory. Hence, by this mechanism, the processing circuitry is allowed to temporarily exit the halted mode in order to enable exception handler code to be executed on the processing circuitry. Accordingly, the exception handler code can then be responsible for ensuring that any other operations that may be required in association with the execution of the debug instruction, taking into account the environment in which the processing circuitry is operating, are performed.

Further, the processing is arranged on returning from the exception, to re-enter the halted mode and perform any additional processing required to complete execution of the given debug instruction. Depending on the operations that are performed by the exception handler code, it may or may not be the case that there are certain additional processing steps to be taken in order to complete execution of the debug instruction once the halted mode has been re-entered. Even if there are not any additional steps required in order to perform the operation specified by the debug instruction, for example because all of those steps have been taken by the exception handler code, it may be the case that the processing circuitry updates a status bit associated with the debug instruction, in order to indicate to the debugger that the debug instruction has been executed.

Hence, by virtue of the techniques described herein, the processing circuitry is provided with a mechanism that allows it to temporarily exit the halted mode so as to allow software to be executed on the processing circuitry in order to determine what steps need to be taken within the apparatus having regard to the debug instruction that has been specified, but on completion of that software the processing circuitry re-enters the halted mode. Furthermore, the fact that the processing circuitry has executed such software is entirely transparent to the debugger, since the processing circuitry is arranged so that it can exit the halted mode transparently to the debugger. Hence, the debugger is not aware that the processing circuitry has exited the halted mode, and thus the techniques described herein require no modification to the way in which the debugger operates.

There are a number of ways in which the processing circuitry can be arranged to exit the halted mode in a manner that is transparent to the debugger. In one example the apparatus further comprises a halted mode control register which is set (e.g. to a logic 1 value) in response to the halt event in order to cause the processing circuitry to enter the halted mode. Further, halt mode indication circuitry is coupled to the halt mode control register to indicate to the debugger whether the processing circuitry is in the halted mode. In order to exit the halted mode, the content of the halted mode control register will need to be cleared (e.g. to a logic 0 value if a logic 1 value indicates the set state), but typically the clearing of the halted mode control register would cause the halt mode indication circuitry to identify to the debugger that the processing circuitry is no longer in the halted mode. However, in accordance with the techniques described herein, the processing circuitry is arranged to exit the halted mode transparently to the debugger by clearing the halted mode control register whilst continuing to cause the halt mode indication circuitry to indicate to the debugger that the processing circuitry is in the halted mode. Hence, in accordance with such an approach, it is ensured that the halt mode indication circuitry produces an output which is not solely dictated by the state of the halt mode control register, hence allowing the above described functionality to be achieved when the processing circuitry temporarily exits the halted mode in order to enable the above-mentioned exception handler code to be executed.

There are a number of ways in which such functionality can be achieved, but in one example implementation the apparatus further comprises an additional control register that is also coupled to the halt mode indication circuitry. Then, following detection of the trigger condition the processing circuitry is arranged to set the additional control register prior to clearing the halted mode control register. Further, the halt mode indication circuitry is arranged to indicate to the debugger that the processing circuitry is in the halted mode when either the halted mode control register or the additional control register is set. Hence, by setting the additional control register prior to clearing the halted mode control register, the debugger continues to be informed that the processing circuitry is in the halted mode.

Further, in one example implementation, on the return from the exception the processing circuitry is arranged to determine whether the additional control register is set, and when the additional control register is set the processing circuitry is arranged to set the halted mode control register in order to cause the processing circuitry to re-enter the halted mode. Hence, whilst the processing circuitry would not normally set the halted mode control register when it returns from handling an exception, in situations where at the time of returning from the exception the additional control register is set, this does cause the processing circuitry to set the halted mode control register, thereby causing the processing circuitry to re-enter the halted mode. Thus, during this entire process, the halt mode indication circuitry continues to indicate to the debugger that the processing circuitry is in the halted mode, and in particular the debugger is unaware that the processing circuitry has temporarily exited the halted mode in order to execute some additional software, in particular the above-mentioned exception handler code.

In one example implementation, on setting the halted mode control register in order to cause the processing circuitry to re-enter the halted mode, the processing circuitry is arranged to clear the additional control register. Hence, at this point, the processing circuitry has returned to the standard halted mode situation, where the halted mode control register is set and the set state of that halted mode control register is used by the halt mode indication circuitry to identify to the debugger that the processing circuitry is in the halted mode.

There are a number of ways in which the exception handler code can be activated by the processing circuitry. However, in one example implementation, on exiting the halted mode following detection of the trigger condition, the processing circuitry is arranged to transition to a predetermined exception level, and the exception handler code is provided in association with that predetermined exception level to determine one or more operations that are required to be performed by the processing circuitry prior to returning to the halted mode.

In some instances, the exception handler code may be provided with multiple different points of entry, and the entry point into the exception handler code may be dependent on the type of trigger condition that has given rise to the need to exit the halted mode. Hence, the operations that need to be performed by the processing circuitry prior to returning to the halted mode may be determined at least partly by the entry point into the exception handler code. However, alternatively, or in addition, the apparatus may further comprise syndrome storage used by the processing circuitry on detection of the trigger condition to store information for reference by the exception handler code when determining the one or more operations that are required to be performed by the processing circuitry prior to returning to the halted mode. Hence, the exception handler code can take into account the information stored in the syndrome storage when deciding what actions need to be performed by the processing circuitry.

By way of example, the trigger condition may be detected by the processing circuitry on encountering any one of a plurality of different scenarios, and the information stored in the syndrome storage may be used to enable the exception handler code to identify which one of the plurality of different scenarios caused the trigger condition to be detected. Hence, by use of the information in the syndrome storage, the exception handler code can distinguish between different situations that have given rise to the trigger condition being detected, and hence can tailor the processing operations performed by the processing circuitry during the period that it has temporarily exited the halted mode taking into account that information.

In one example implementation, the apparatus further comprises state saving storage used by the processing circuitry on detection of the trigger condition to capture a number of items of current state information prior to exiting the halted mode transparently to the debugger, for use by the processing circuitry when in due course re-entering the halted mode on the return from the exception. Hence, sufficient information about the current state of the processing circuitry prior to temporarily exiting the halted mode can be retained so as to enable that state to be recreated when in due course the processing circuitry re-enters the halted mode.

There are a number of reasons why the trigger condition may be detected when executing a given debug instruction. For example, the processing circuitry may be arranged to detect the trigger condition when performance of a required operation specified by the given debug instruction also requires one or more additional operations to be performed, taking into account operating information of the processing circuitry. Hence, it may be that the processing circuitry hardware can perform the required operation specified by the given debug instruction. However, it may be that certain operating information of the processing circuitry indicates that one or more additional operations also need to be performed when performing the operation specified by the given debug instruction. Such additional operations may typically require execution of one or more additional instructions by the processing circuitry, and traditionally that would not have been possible, since in the halted mode the processing circuitry can only execute the actual debug instructions provided by the debugger. Nevertheless, by virtue of the techniques described herein, it is possible for the processing circuitry to temporarily exit the halted mode in a manner transparent to the debugger, so as to enable code to be executed by the processing circuitry to implement those additional operations.

There are a number of reasons why additional operations may be required. For example, in modern data processing systems, complex operating environments can be established, where a series of additional operations are performed, such as background access checking, encryption, and/or other complex services. When in normal operating mode, the processing circuitry can be arranged to execute a sequence of instructions that cause such additional operations to be performed, but such operations cannot be performed natively by the processing circuitry hardware without the execution of such instructions, and accordingly those additional operations will not occur automatically when executing a given debug instruction whilst the processing circuitry is in the halted mode. However, through use of the mechanism described earlier, it is possible for the processing circuitry to implement those additional operations, by temporarily exiting the halted mode in a manner transparent to the debugger.

As a specific example of such a complex operating environment where one or more additional operations may be required, the processing circuitry may be arranged to be operable in a plurality of realms, and the trigger condition may be detected when the required operation specified by the given debug instruction will cause a realm transition. In such a realm-based environment, a given memory region may be associated with an owner realm specified from multiple realms, where each realm corresponds to a portion of at least one software process, such as a virtual machine or hypervisor, which may be an untrusted hypervisor. Processing circuitry processes software processes at one of a plurality of exception levels associated with different levels of privilege. The owner realm has a right to exclude other realms from accessing data stored within the given memory region, i.e. the owner realm has exclusive rights to control access. Such an approach can improve security, since it provides a mechanism via which a process at a lower level of privilege can prevent access to a particular region of memory by a process having a higher level of privilege, and hence does not rely on making an assumption that software at a higher level of privilege has to be more trusted than software at a lower level of privilege.

Whilst such an approach can improve security, care has to be taken when transitioning into or out of a realm. In particular, when exiting a current realm, or when entering a realm, the processing circuitry will typically undertake a number of tasks aimed at ensuring the security of the data associated with that realm. For example, when exiting a current realm, then it may be considered appropriate to zero the contents of at least a subset of the registers of the processing circuitry, so as to ensure that the data held in those registers is not made available outside of the realm. Hence, it will be seen that this is a specific example where, in association with executing an instruction that causes a transition into or out of a realm, it would be necessary for the processing circuitry to perform one or more additional operations that are not directly defined by the instruction itself. Hence, if when the processing circuitry is seeking to execute a given debug instruction, it is detected that the execution of that debug instruction will cause a realm transition, then the above described mechanism can be invoked so that the processing circuitry temporarily exits the halted mode, in order to allow the above described additional operations to be performed, thus ensuring that the integrity of the realms is not compromised.

In addition to situations where performance of a required operation specified by a given debug instruction also requires one or more additional operations to be performed, as another example of a situation where the trigger condition may be detected, it may be that the required operation specified by the given debug instruction cannot be performed directly by the processing circuitry in response to the given debug instruction. In particular, it may be that the processing circuitry hardware does not support the performance of that operation in response to a single specified instruction. Instead, it may be that the processing circuitry needs to execute a sequence of instructions fetched from memory in order to implement the required operation. However, even if the processing circuitry hardware cannot natively support the execution of the given debug instruction, the mechanism described herein enables the required operation to be implemented by allowing the processing circuitry to temporarily exit the halted mode, so as to enable it to execute the required sequence of instructions necessary to perform the required operation.

Hence, even if the given debug instruction specifies a complex operation that the processing circuitry hardware cannot natively perform in response to that single specified debug instruction, the techniques described herein can provide a mechanism to enable the required operation to be implemented, in a manner that is entirely transparent to the debugger. In particular, as far as the debugger is concerned, the given debug instruction has been executed by the processing circuitry whilst the processing circuitry is in the halted mode, and that the fact that the processing circuitry has temporarily exited the halted mode, and executed a sequence of instructions in order to implement the required operation, is hidden from the debugger.

Particular examples will now be described with reference to the Figures.

FIG. 1 is a block diagram of an apparatus in accordance with one example implementation. Processing circuitry 10 is provided for executing a sequence of instructions fetched from memory. As shown, the processing circuitry typically comprises a sequence of pipeline stages used to execute such instructions. In particular, instructions may be fetched from memory by the fetch stage 15, and then routed via the multiplexer 20 to the decode stage 25, where the instructions are decoded in order to identify the operations that are required to be performed. Decoded instructions are then forwarded to the issue stage 30, where the decoded instructions may be queued while they are waiting for the required source operands to become available. Thereafter, the instructions may be issued to the execute stage 35, which performs the operations required by the decoded instructions.

As shown in FIG. 1, a debug interface 40 may be provided to enable an external debugger to access the processing circuitry in order to perform various debug operations. The debug interface 40 can be organised in a variety of ways, but in the example shown includes a JTAG/serial wire interface 45 to enable communication with an external debugger using either JTAG or serial wire protocols. Further, an access port 50 is provided via which the debug interface communicates with a number of components used to support debug functionality within the apparatus. In particular, as shown, the access port 50 may be coupled to a number of register components 65, 75, 80 via a communication bus 52, and via the access port 50 the debugger may perform write or read operations with respect to those registers.

On the occurrence of a halt event, a halted mode control register 55 is set in order to place the processing circuitry 10 into a halted mode of operation. In this mode of operation, the set state of the halted mode control register 55 causes the multiplexer 20 to take its input from the instruction transfer register (ITR) 75, rather than from the fetch stage 15. Accordingly, once the processing circuitry has entered the halted mode, the instructions executed by the processing circuitry will no longer be instructions fetched from memory by the fetch stage, but instead will be debug instructions as indicated by the contents of the ITR 75.

Once the halted mode control register is set, then the halt mode indication circuitry 60 will output a halted indication stored within the halted status register 65 accessible to the debug interface 40. Hence, by polling the contents of the halted status register 65, the debugger can ascertain whether the processing circuitry is in the halted mode or not. Whilst the processing circuitry is in the halted mode, the debug interface 40 can be used by the debugger to perform write and read operations in respect of the ITR 75 and the data transfer register (DTR) 80 in order to cause a series of debug operations to be performed on the processing circuitry. For example, the debugger can cause a debug instruction to be written into the instruction transfer register 75 when a ready bit (R bit) associated with that register indicates that the processing circuitry is ready to receive a new debug instruction. That instruction can then be routed via the multiplexer 20 to the decode stage 25 of the processing circuitry, in order to cause the debug instruction to be decoded, and then subsequently executed by the execute stage 35. Once execution of the debug instruction is complete, the ready bit can be set in the ITR 75 to identify that the instruction execution has been completed. This then provides a mechanism for identifying to the debugger that the instruction has been completed, hence enabling a next debug instruction to be written into the ITR.

In a similar fashion, one or more data transfer registers (DTRs) 80 can be provided for either storing write data to be input into the apparatus during the performance of debug write operations, or to store data that has been read out from the apparatus during the performance of debug read operations. Such read data can then be accessed from the DTR 80 via the debug interface 40.

As discussed earlier, there can be certain situations where it may be impractical for the processing circuitry hardware 10 to respond natively to an operation required by a particular debug instruction indicated in the ITR 75. This could for example be due to the fact that the debug instruction specifies a complex operation that cannot be directly implemented by the processing circuitry pipeline in response to a single instruction, and instead the processing circuitry requires that operation to be emulated through the execution of a series of instructions.

However, as another example, the processing circuitry may reside within an apparatus that is deploying a complex environment, where in association with certain operations a number of additional operations need to be performed, for example background access checks, encryption, etc. As discussed earlier, a particular example of such a scenario is where the apparatus is arranged to operate in a realm-based environment. In such a realm-based environment, additional security can be achieved by not needing to rely on software at a higher privilege level necessarily being more trusted than software at a lower privilege level. Instead, any particular memory region can be associated with an owner realm, where that realm corresponds to a software process or a portion thereof. The owner realm has a right to exclude other realms from accessing data stored within its identified memory region, even if those other realms relate to software at a higher privilege level. In systems that employ a hypervisor, this for example can be used to manage security of data within the system, even in instances where the hypervisor is an untrusted hypervisor.

However, to ensure that the integrity of the realms is maintained, when certain operations are performed it is required for additional operations to also be performed. As a particular example, if an instruction, when executed, will cause an exit from a current realm, or an entry into a realm, then additional operations will typically be performed by realm management circuitry (which can be considered to be part of the processing circuitry 10) in order to ensure that the access control rights to data are managed correctly taking into account the access rights defined by the various realms. For more information on realm management within a realm-based system, the reader is referred to UK published patent application GB2,563,884A, the entire contents of which are hereby incorporated by reference. By way of example, FIGS. 28 and 29 of that document describe steps taken on realm entry and realm exit.

Hence, in such a situation, if the debug instruction stored within the ITR 75 requires the processing circuitry to perform an operation which will cause an exit from a current realm or an entry into a realm, then it would be undesirable for the processing circuitry merely to implement the operation specified by the debug instruction without also implementing the associated operations required for realm integrity. However, when in the halted mode, the processing circuitry can only execute the instructions provided via the ITR 75.

In order to address the above issues, in accordance with the techniques described herein, the processing circuitry is provided with a mechanism that enables it to selectively exit the halted mode transparently to be the debugger so as to allow it to take an exception in order to execute exception handler code comprising a number of instructions fetched from memory. This provides the flexibility for the processing circuitry to implement any operations that would be required in addition to the operation specified by the debug instruction, and hence for example to enable a series of instructions to be executed to ensure realm integrity is preserved in the above specific example. Also, in situations where the processing circuitry may not be able to directly implement the operation specified by the debug instruction, it provides a mechanism for the processing circuitry to emulate the required operation by executing a sequence of instructions fetched from memory.

In order to achieve this functionality, an additional status register 70 is provided that provides a "was halted" indication. The halt mode indication circuitry 60 is then driven by the output of both the halted mode control register 55 and the was halted indication register 70, such that if either one of those registers is set, the halted status stored within the halted status register 65 indicates that the processing circuitry is in the halted mode. As a result, this allows the processing circuitry to temporarily clear the halted mode control register 55, so as to allow it to exit the halted mode, whilst the halted status register 65 is still set, and hence the debugger will determine that the processing circuitry is still in the halted mode. The process performed by the processing circuitry when temporarily exiting the halted mode will be discussed in more detail with reference to the flow diagram of FIG. 2, but in summary, on clearing the halted mode control register 55 in order to temporarily exit the halted mode, the processing circuitry is arranged to transition to a predetermined exception level, where an exception handling routine is executed, involving the fetching of a series of instructions from memory which are then executed in order to perform a determined sequence of operations. In order to enable the processing circuitry to return to its original state on return from the exception, then prior to taking the exception, state saving storage 85 is populated with certain items of state information, so that on the return from the exception the contents of the state saving storage can be used in order to return the processing circuitry to its original state. In addition, one or more syndrome registers 90 can be used to store information that can be used by the exception handling routine to determine the reason why the halted mode has been temporarily exited, and hence assist the exception handling routine in determining the required operations to be performed prior to the processing circuitry returning to the halted mode.

Figure 2A:
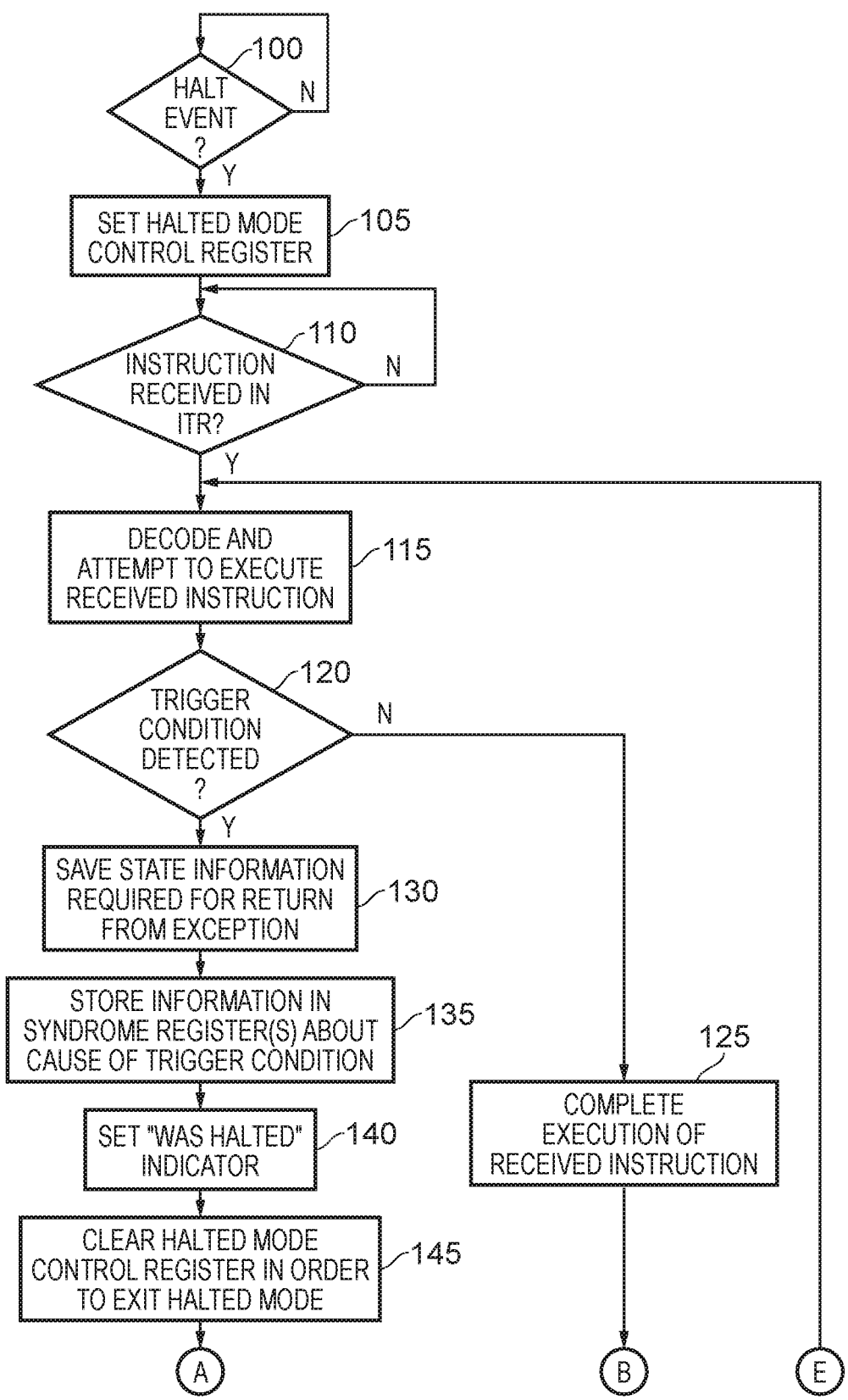
FIGS. 2A to 2C provide a flow diagram illustrating steps that may be performed by the apparatus of FIG. 1 in response to a halt event, in accordance with one example implementation.
Figure 2B:
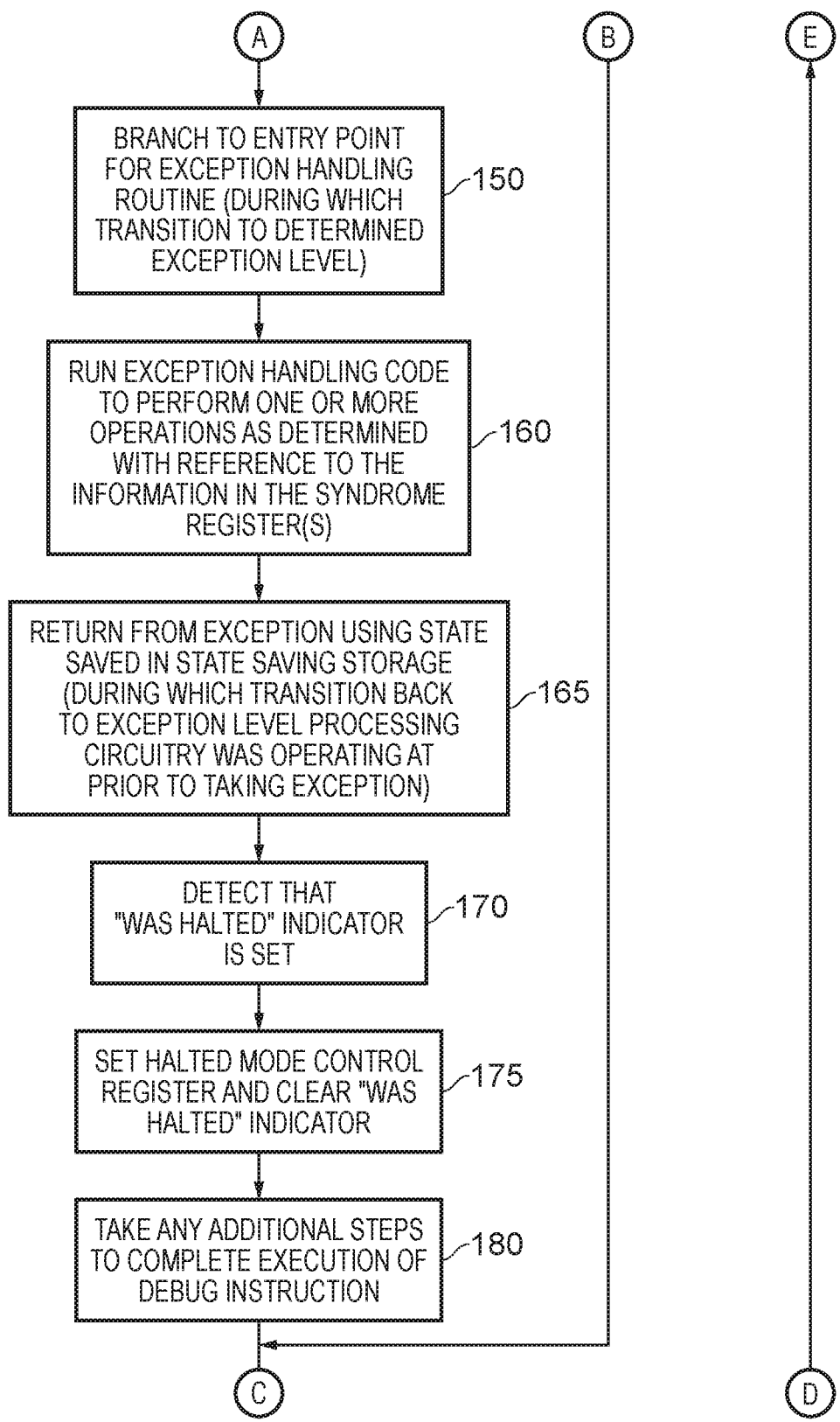
Figure 2C:
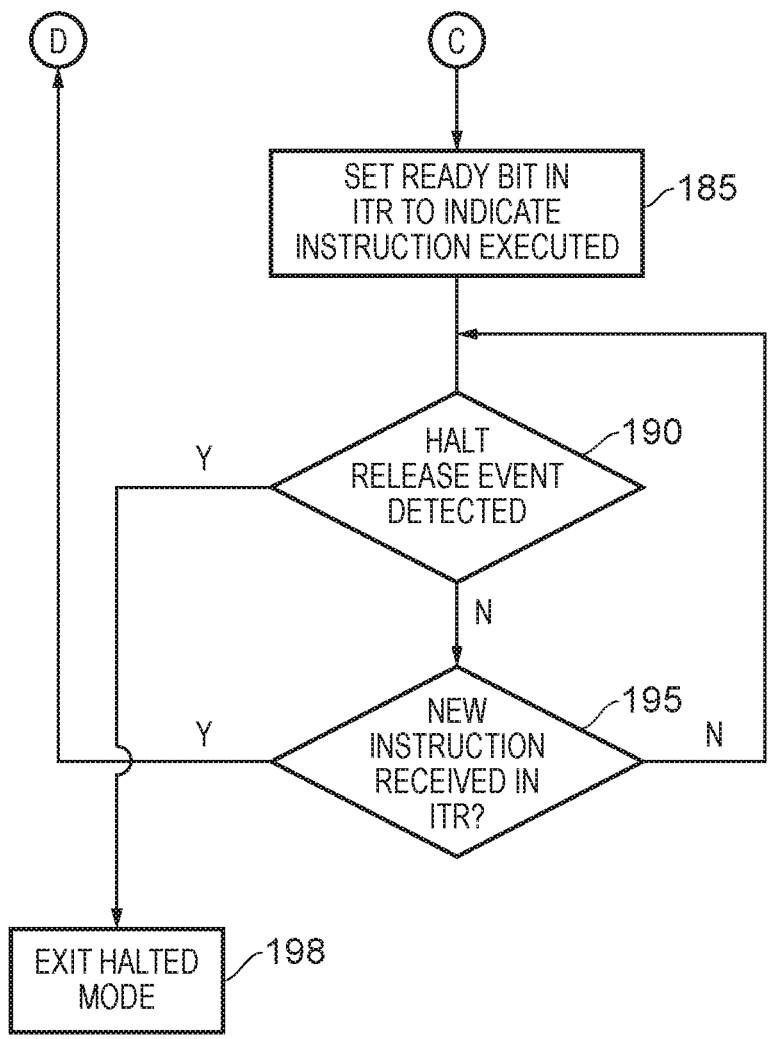

FIGS. 2A to 2C provide a flow diagram illustrating steps performed by the apparatus of FIG. 1 following detection of a halt event. At step 100, it is determined whether a halt event has been detected. The halt event could arise for a variety of reasons. For example, the halt event may occur directly in response to a halt command issued by the debugger, or alternatively it could result from an external halt trigger arising from elsewhere in the system. As another example, such a halt event may arise due the processing circuitry detecting a breakpoint or watchpoint condition that has been set within breakpoint or watchpoint registers referenced by the processing circuitry.

When a halt event is detected as step 100, then at step 105 the halted mode control register 55 is set, thereby placing the processing circuitry into the halted mode of operation, and causing the multiplexer 20 to select as its output the input it receives from the ITR 75. At step 110, it is determined whether an instruction has been received into the ITR 75, and when such an instruction is detected, the process proceeds to step 115 where the processing circuitry 10 attempts to decode and execute the received instruction. During this process, it is determined at step 120 whether a trigger condition is detected. If not, then at step 125 execution of the received instruction is completed in the normal manner.

However, in the event that the trigger condition is detected, this indicates that the processing circuitry is unable to natively complete execution of the debug instruction, either because it cannot natively perform the operation required by that debug instruction, or because, taking into account the operating environment of the processing circuitry, it is the case that one or more additional operations also need to be performed in association with the operation required by the debug instruction.

If the trigger condition is detected, then at step 130 current state information of the processing circuitry is saved into the state saving storage 85 in order to enable a later restoration of the processing circuitry to that state following the handling of an exception. At this point, all the usual information that would normally be stored prior to taking an exception can be saved.

Further, at step 135, information is stored in one or more syndrome registers 90 about that cause of the trigger condition, and hence for example this information may identify the action being performed by the processing circuitry at the time the trigger condition was detected.

At step 140, the was halted indication register 70 is set, and then at step 145 the halted mode control register 55 is cleared in order to cause the processing circuitry to exit the halted mode. Since at this point the was halted indicator is now set, it will be appreciated from FIG. 1 that the halt mode indication circuitry 60 will still indicate that the processing circuitry is in the halted mode, and hence the exit from the halted mode at step 145 will be transparent to the debugger.

At step 150, the processing circuitry then branches to an entry point for an exception handling routine used to respond to the detected trigger condition. This will typically be a dedicated exception handling routine used in such situations, and during step 150 the processor will transition to a predetermined exception level in which that exception handling routine is run. There may be a single entry point into the exception handling routine that is always used, or alternatively there may be a number of different entry points, with the entry point used being dependent at least partly on the nature of the event that gave rise to the trigger condition being detected.

At step 160, instructions are fetched from memory as required to run the exception handling code. Execution of these instructions will cause the performance of one or more operations that will typically be determined with reference to the information in the syndrome register(s) 90. It should be noted that even in instances where there are multiple different entry points into the exception handling routine, it may still be useful to have some additional information in the syndrome registers that can be referenced by the exception handling code when determining exactly which operations need to be performed.

Once the exception handling code has performed the required operations, then the processing circuitry is arranged at step 165 to return from the exception, using the state information saved in the state saving storage 85 in order to return the processing circuitry to the state that it was in at the point the exception was taken. During this process, the processing circuitry will typically transition back to the exception level that that processing circuitry was operating in prior to the exception being taken.

As indicated at step 170, at this point the processing circuitry will detect that the was halted indicator is set within the register 70. A check of the status of the was halted register 70 is performed here, since it will not always be the case that the processing circuitry has exited the halted mode in order to run an exception handling routine, and on a normal return from an exception handling routine there will be no need to re-enter the halted mode. However, in this instance the was halted indicator is set, and accordingly at step 175 the processing circuitry proceeds to set the halted mode control register 55 and clears the was halted indicator in the register 70. As a result, the processing circuitry re-enters the halted mode, and again this is transparent to the debugger, since during the intervening period following the original setting of the halted mode control register at step 105, the halt mode indication circuitry 60 will have continued to assert that the processing circuitry is in the halted mode.

At step 180, the processing circuitry then takes any additional steps required to complete execution of the debug instruction. It may be that the software run by the exception handling routine has itself performed the operation required by the debug instruction, or alternatively it may merely have performed a series of related operations that are required when performing the operation required by the debug instruction, and may in that instance leave it to the processing circuitry to then perform the operation required by the debug instruction after return from the exception. In any event, following completion of the debug instruction, the processing circuitry will at step 185 set the ready bit in the ITR 75 in order to indicate to the debugger that the debug instruction has been executed.

As will be apparent from FIGS. 2A and 2B, if execution of the received instruction is completed normally at step 125, then all of steps 130 to 180 will be bypassed and instead the process will proceed directly to step 185 where the ready bit is set in the ITR to indicate that the instruction has been executed.

At step 190, it is determined whether a halt release event has been detected, and if not it is determined at step 195 whether a new instruction is received in the ITR 75. At some point, either a new instruction will be received within the ITR 75, or the halt mode will be ended by detection of a halt release event. If a halt release event is detected, the process proceeds to step 198 where the processing circuitry exits the halted mode by clearing the halted mode control register 55. However, if a new instruction is received in the ITR whilst the processing circuitry is still in the halted mode, then as shown in FIGS. 2A to 2C, processing returns to step 115, where that new debug instruction is decoded and an attempt is made to execute it.

Figure 3:
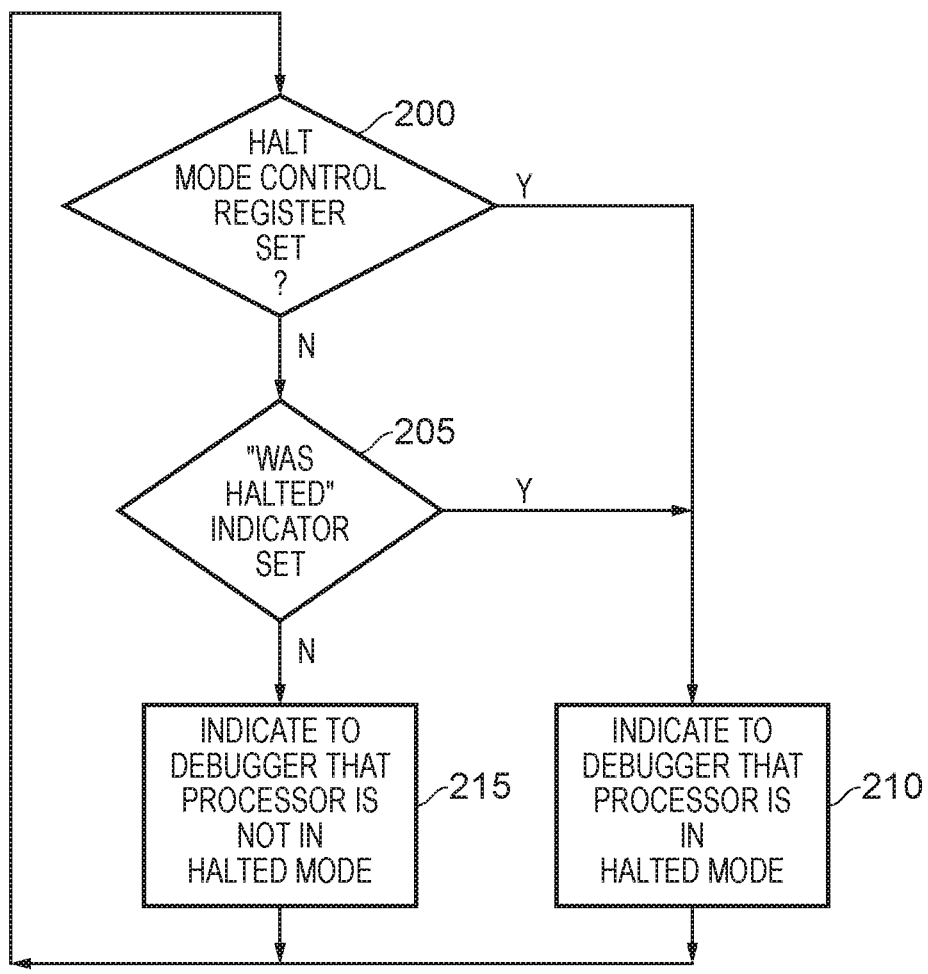
FIG. 3 is a flow diagram illustrating the operation of the halt mode indication circuitry of FIG. 1 in accordance with one example implementation.

FIG. 3 is a flow diagram illustrating the operation of the halt mode indication circuitry 60. At step 200, it is determined whether the halted mode control register 55 is set, and if so the halt mode indication circuitry 60 indicates to the debugger at step 210 that the processor is in the halted mode. There are a number of ways in which this indication can be provided to the debugger, but in the example of FIG. 1 the halted status register 65 is set, and that register can be poled by the debugger via the debug interface 40 in order to determine the current status of the processing circuitry, and in particular whether the processing circuitry is in the halted mode or not.

If the halted mode control register is not set, then at step 205 it is determined whether the was halted indicator register 70 is set. If so, then again the process proceeds to step 210 where the halt mode indication circuitry 60 indicates to the debugger that the processor is in the halted mode.

However, if the was halted indicator is not set at step 205, then at step 215 the halted mode indication circuitry 60 indicates to the debugger that the processor is not in the halted mode.

Through the provision of the was halted indicator 70, and by driving the halted mode indication circuitry 60 based on a logical OR of the state in the halted mode control register 55 and the was halted indicator register 70, this enables the processing circuitry 10 to selectively exit the halted mode while still indicating to the debugger that the processing circuitry is in the halted mode.

By virtue of the above described techniques, an apparatus being debugged by a debugger is provided with a mechanism to enable that apparatus to selectively exit a halted mode in a manner that is transparent to the debugger. This enables the processing circuitry within the apparatus to take an exception in order to execute exception handling code comprising a sequence of instructions fetched from memory, allowing the processing circuitry to respond appropriately to certain operations that might be specified by debug instructions in a situation where it would not be possible, or would be impractical, for the processing circuitry to do so while staying in the halted mode. Since the temporary transition out of the halted mode is hidden from the debugger, the mechanism can be implemented without changing the operational behaviour of the debugger.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus comprising:
processing circuitry to execute instructions fetched from memory; and
a debug interface;
wherein the processing circuitry is responsive to a halt event to enter a halted mode where the processing circuitry stops executing the instructions fetched from memory and instead is arranged to execute debug instructions received from a debugger via the debug interface;
wherein the processing circuitry is responsive to detection of a trigger condition when executing a given debug instruction to:
exit the halted mode transparently to the debugger;
take an exception in order to execute exception handler code comprising a sequence of instructions fetched from the memory; and
on return from the exception, re-enter the halted mode and perform any additional processing required to complete execution of the given debug instruction;
wherein the apparatus further comprises:
a halted mode control register which is set in response to the halt event in order to cause the processing circuitry to enter the halted mode; and
halt mode indication circuitry coupled to the halt mode control register to indicate to the debugger whether the processing circuitry is in the halted mode;
wherein the processing circuitry is arranged to exit the halted mode transparently to the debugger by clearing the halted mode control register whilst continuing to cause the halt mode indication circuitry to indicate to the debugger that the processing circuitry is in the halted mode.

2. An apparatus as claimed in claim 1, further comprising:
an additional control register that is also coupled to the halt mode indication circuitry;
wherein following detection of the trigger condition the processing circuitry is arranged to set the additional control register prior to clearing the halted mode control register, and the halt mode indication circuitry is arranged to indicate to the debugger that the processing circuitry is in the halted mode when either of the halted mode control register and the additional control register is set.

3. An apparatus as claimed in claim 2, wherein on the return from the exception the processing circuitry is arranged to determine whether the additional control register is set, and when the additional control register is set the processing circuitry is arranged to set the halted mode control register in order to cause the processing circuitry to re-enter the halted mode.

4. An apparatus as claimed in claim 3, wherein on setting the halted mode control register in order to cause the processing circuitry to re-enter the halted mode, the processing circuitry is arranged to clear the additional control register.

5. An apparatus as claimed in claim 1, wherein on exiting the halted mode following detection of the trigger condition, the processing circuitry is arranged to transition to a predetermined exception level, and the exception handler code is provided in association with that predetermined exception level to determine one or more operations that are required to be performed by the processing circuitry prior to returning to the halted mode.

6. An apparatus comprising:
processing circuitry to execute instructions fetched from memory; and
a debug interface;
wherein the processing circuitry is responsive to a halt event to enter a halted mode where the processing circuitry stops executing the instructions fetched from memory and instead is arranged to execute debug instructions received from a debugger via the debug interface;
wherein the processing circuitry is responsive to detection of a trigger condition when executing a given debug instruction to:
exit the halted mode transparently to the debugger;
take an exception in order to execute exception handler code comprising a sequence of instructions fetched from the memory; and
on return from the exception, re-enter the halted mode and perform any additional processing required to complete execution of the given debug instruction;
wherein on exiting the halted mode following detection of the trigger condition, the processing circuitry is arranged to transition to a predetermined exception level, and the exception handler code is provided in association with that predetermined exception level to determine one or more operations that are required to be performed by the processing circuitry prior to returning to the halted mode;
wherein the apparatus further comprises syndrome storage used by the processing circuitry on detection of the trigger condition to store information for reference by the exception handler code when determining the one or more operations that are required to be performed by the processing circuitry prior to returning to the halted mode.

7. An apparatus as claimed in claim 6, wherein the trigger condition is detected by the processing circuitry on encountering any one of a plurality of different scenarios, and the information stored in the syndrome storage is used to enable the exception handler code to identify which one of the plurality of different scenarios caused the trigger condition to be detected.

8. An apparatus as claimed in claim 1, further comprising state saving storage used by the processing circuitry on detection of the trigger condition to capture a number of items of current state information prior to exiting the halted mode transparently to the debugger, for use by the processing circuitry when in due course re-entering the halted mode on the return from the exception.

9. An apparatus as claimed in claim 1, wherein the processing circuitry is arranged to detect the trigger condition when performance of a required operation specified by the given debug instruction also requires one or more additional operations to be performed, taking into account operating information of the processing circuitry.

10. An apparatus as claimed in claim 9, wherein the processing circuitry is arranged to be operable in a plurality of realms, and the trigger condition is detected when the required operation specified by the given debug instruction will cause a realm transition.

11. An apparatus as claimed in claim 10, wherein said realm transition is an entry into a realm, or an exit from a current realm.

12. An apparatus as claimed in claim 10, wherein:
the processing circuitry is arranged to execute a plurality of processes; and
when operating in a given realm, the processing circuitry is executing an associated process that has control of access to a block of physical addresses identified as being owned by that process.

13. An apparatus as claimed in claim 1, wherein the processing circuitry is arranged to detect the trigger condition when a required operation specified by the given debug instruction cannot be performed directly by the processing circuitry in response to the given debug instruction, and instead the processing circuitry needs to execute a sequence of instructions fetched from memory in order to implement the required operation.

14. A method of executing debug instructions, comprising:
employing processing circuitry to execute instructions fetched from memory;
causing the processing circuitry to respond to a halt event by entering a halted mode where the processing circuitry stops executing the instructions fetched from memory and instead is arranged to execute debug instructions received via a debug interface from a debugger;
setting a halted mode control register in response to the halt event in order to cause the processing circuitry to enter the halted mode; and
indicating to the debugger, using halt mode indication circuitry coupled to the halt mode control register, whether the processing circuitry is in the halted mode;
in response to detection of a trigger condition when executing a given debug instruction, causing the processing circuitry to:
exit the halted mode transparently to the debugger;
take an exception in order to execute exception handler code comprising a sequence of instructions fetched from the memory; and
on return from the exception, re-enter the halted mode and perform any additional processing required to complete execution of the given debug instruction;
wherein the exiting of the halted mode transparently to the debugger is performed by clearing the halted mode control register whilst continuing to cause the halt mode indication circuitry to indicate to the debugger that the processing circuitry is in the halted mode.

* * * * *